United States Patent
Lin

(10) Patent No.: US 6,329,241 B1
(45) Date of Patent: Dec. 11, 2001

(54) METHODS FOR PRODUCING CAPACITOR-NODE CONTACT PLUGS OF DYNAMIC RANDOM-ACCESS MEMORY

(75) Inventor: Wei-Ray Lin, Taipei (TW)

(73) Assignee: Nanya Technology Corporation (TW)

(*) Notice: Subject to any disclaimer, the term of this patent is extended or adjusted under 35 U.S.C. 154(b) by 0 days.

(21) Appl. No.: 09/562,183

(22) Filed: May 2, 2000

(30) Foreign Application Priority Data

Jan. 18, 2000 (TW) .................................................. 89100709

(51) Int. Cl.$^7$ ...................... H01L 21/8242; H01L 27/108
(52) U.S. Cl. .......................... 438/253; 438/254; 438/396; 438/397; 257/306
(58) Field of Search ........................... 438/239, 253–256, 438/396–399; 257/306, 311

(56) References Cited

U.S. PATENT DOCUMENTS

| | | | |
|---|---|---|---|
| 5,780,339 | * 7/1998 | Liu et al. | 438/253 |
| 5,895,239 | * 4/1999 | Jeng et al. | 438/239 |
| 5,956,594 | * 9/1999 | Yang et al. | 438/396 |
| 6,022,776 | * 2/2000 | Lien et al. | 438/253 |
| 6,028,360 | * 2/2000 | Nakamura et al. | 257/758 |
| 6,074,908 | * 6/2000 | Huang | 438/241 |
| 6,077,742 | * 6/2000 | Chen et al. | 438/255 |
| 6,184,081 | * 2/2001 | Jeng et al. | 438/253 |

\* cited by examiner

*Primary Examiner*—Eddie Lee
*Assistant Examiner*—José R Díaz
(74) *Attorney, Agent, or Firm*—George T. Marcou; Kilpatrick Stockton LLP

(57) ABSTRACT

A method for producing capacitor-node contact plugs of a dynamic random access memory, comprising: providing a semiconductor substrate; forming at least one gate structure separated by a first isolation layer as a word line, and forming a source region and a drain region next to the word line; forming a second isolation layer to cover the first isolation layer, word line, source region, and drain region; forming a first landing pad, which passes through the second isolation layer and couples to the source region, wherein the first landing pad is offset a given distance along the word line; forming a third isolation layer to cover the second isolation layer and the first landing pad; forming a second landing pad coupled to the drain region through the second isolation layer and the third isolation layer; forming at least one bit line separated by a fourth isolation layer along the vertical direction to the word line, wherein the at least one bit line is coupled to the second landing pad; forming a fifth isolation layer to cover the at least one bit line separated by the fourth isolation layer; and forming a capacitor-node contact plug, which is coupled to the side wall and a part of the top of the first landing pad through the fifth isolation layer, the third isolation layer, and the second isolation layer.

19 Claims, 11 Drawing Sheets

METHODS FOR PRODUCING CAPACITOR-NODE CONTACT PLUGS OF DYNAMIC RANDOM-ACCESS MEMORY

BACKGROUND OF THE INVENTION

1. Field of the Invention

The present invention relates to a method for producing capacitor-node contact plugs, and more particularly to a method for producing capacitor-node contact plugs in a DRAM (Dynamic Random Access Memory).

2. Description of the Prior Art

Prior semiconductor memory devices, for example the Dynamic Random Access Memory(DRAM), generally exist in the form of matrix, as shown in FIG. 1. In a semiconductor substrate with a T shape active region (AC), several parallel word lines (WL) arc formed. Next, on the sides of the word lines in the T shape region, source regions (S) and drain regions (D) are formed. Bit line contact pads (BC) are formed and coupled to an extend region (ED) of the T shape active region. A capacitor-node contact plug (CC) is coupled to the source region in turns. The extend region is the extension of the drain region. Bit lines are formed and coupled to the bit lines contact pads (BC), which are vertical to the word lines.

However, due to the trend for reducing the size of the DRAM, the contact area of the capacitor-node contact plugs with the landing pads or source regions in the lower layer is reduced. Because the capacitor-node contact plugs can touch the bit lines and the word lines easily, the formation of the capacitor-node contact plugs is more difficult, and the tolerance may not increase effectively.

SUMMARY OF THE INVENTION

To overcome the above-mentioned problems, the present invention provides a method for producing capacitor-node contact plugs of a dynamic random access memory, comprising: providing a semiconductor substrate; forming at least one gate structure separated by a first isolation layer as a word line, and forming a source region and a drain region next to the word line; forming a second isolation layer to cover the first isolation layer, word line, source region, and drain region; forming a first landing pad, which passes through the second isolation layer and couples to the source region, wherein the first landing pad is offset a given distance along the word line; forming a third isolation layer to cover the second isolation layer and the first landing pad; forming a second landing pad coupled to the drain region through the second isolation layer and the third isolation layer; forming at least one bit line separated by a fourth isolation layer along the vertical direction to the word line, wherein the at least one bit line is coupled to the second landing pad; forming a fifth isolation layer to cover the at least one bit line separated by the fourth isolation layer; and forming a capacitor-node contact plug, which is coupled to the side wall and a part of the top of the first landing pad through the fifth isolation layer, the third isolation layer, and the second isolation layer.

BRIEF DESCRIPTION OF THE DRAWINGS

The present invention will become more fully understood from the detailed description given hereinbelow and the accompanying drawings, given by way of illustration only and thus not intended to be limitative of the present invention.

From FIG. 2 to FIG. 8 show a cross sectional view of the process of producing the capacitor-node contact plugs.

DETAILED DESCRIPTION OF THE INVENTION

From FIG. 2 to FIG. 8 show a cross sectional view of the process of producing the capacitor-node contact plugs according to an embodiment of the present invention.

Figure 1:
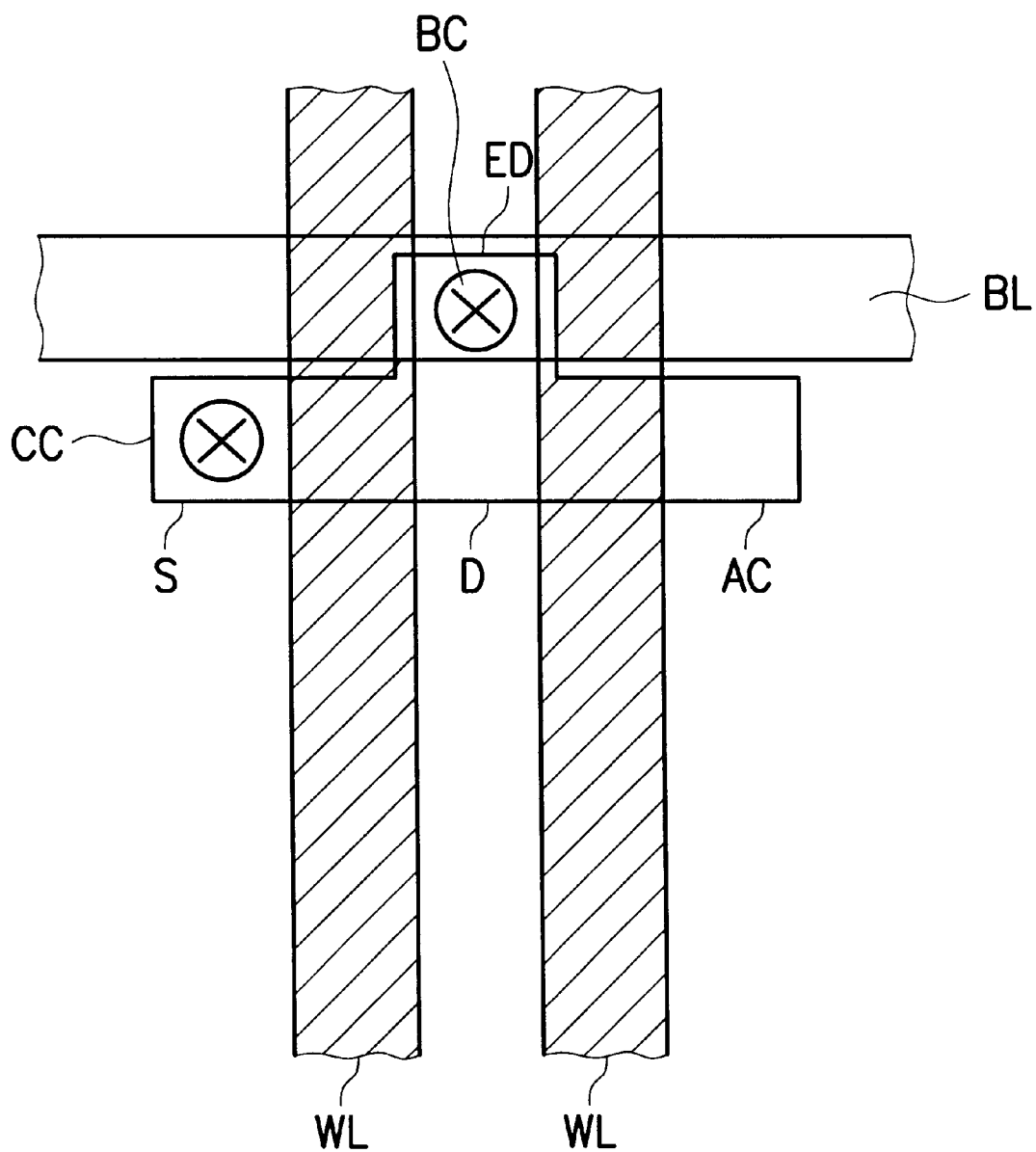
FIG. 1 shows a layout view of the prior capacitor-node contact plug.
Figure 2A:
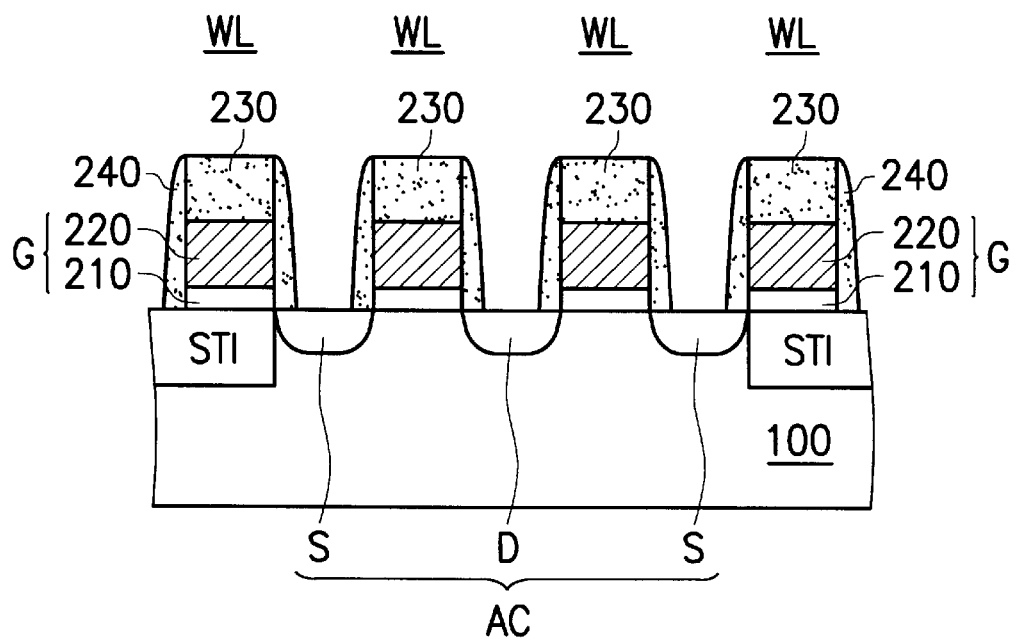

FIG. 2A shows a cross sectional view of the word lines. The method of the present embodiment begins by providing a semiconductor substrate 100, e.g., a P-type semiconductor substrate composed of silicon. Then, use the isolation processor to form several shallow trench isolation (STI) structures for defining rectangular active regions on the semiconductor substrate. Then form the gate structure to be the word lines on the active region of the semiconductor substrate by process of the prior art (e.g., deposition, photolithography, and etching). The gate structure comprises a gate oxide layer 210 and gate conductivity layer 220, and the side walls and the top of the gate structure are separated by the isolation layer, e.g., the nitride silicon isolation layer 240, and the nitride silicon top layer 230. The gate conductivity layer 220 is composed of polysilicon layers and silicide tungsten layers.

Figure 2B:
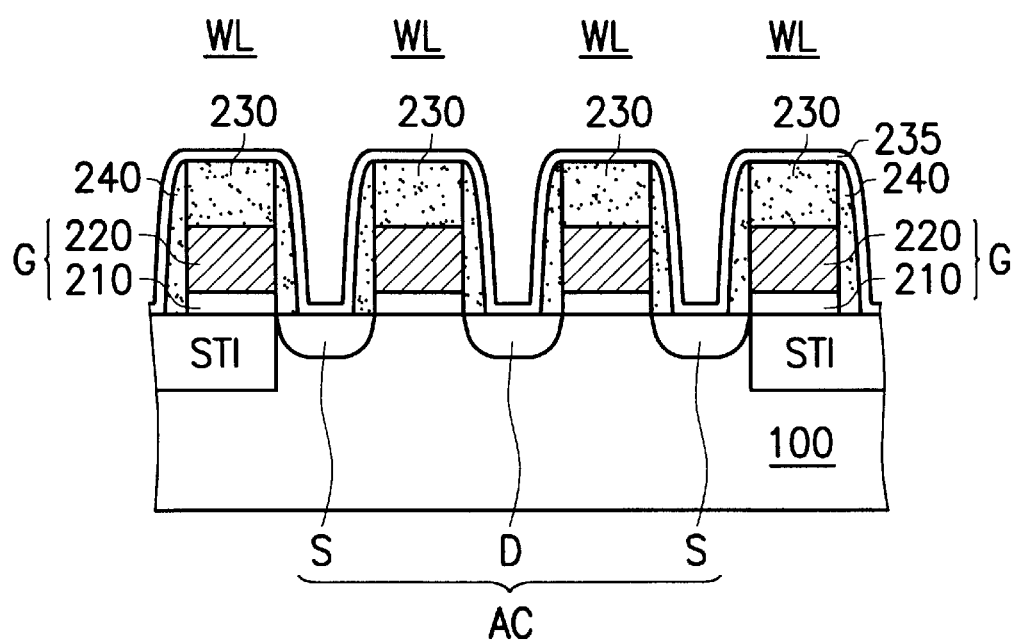

As shown in the FIG. 2B, in order to form an etching termination layer necessary for follow-up etching process, a buffer layer can be selectively formed by, for example, using the CVD (chemical vapor deposition) process to form a isolation layer 235 conformal to the surface of the word lines (WL) and the semiconductor substrate 100. The isolation can be, for example, a nitride silicon layer. The source region (S), and the drain region (D) are formed on the rectangular active regions beside the gate structure with the ion implantation process, and together with the word lines (WL) comprise a transistor.

Figure 3:
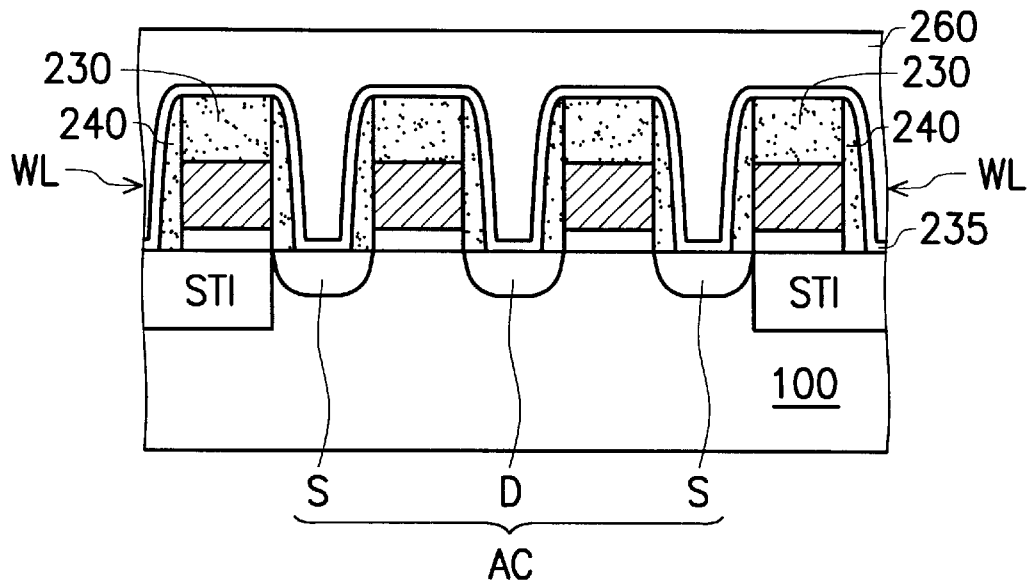

As shown in the FIG. 3, an isolation layer is formed for covering the word lines (WL), the source region (S), and the drain region (D), by using, for example, CVD to form a isolation layer 260, such as an oxide layer, and then using a planarization process, e.g., CMP (chemical mechanical polishing) or etching back to planarize the isolation layer 260.

Figure 4:
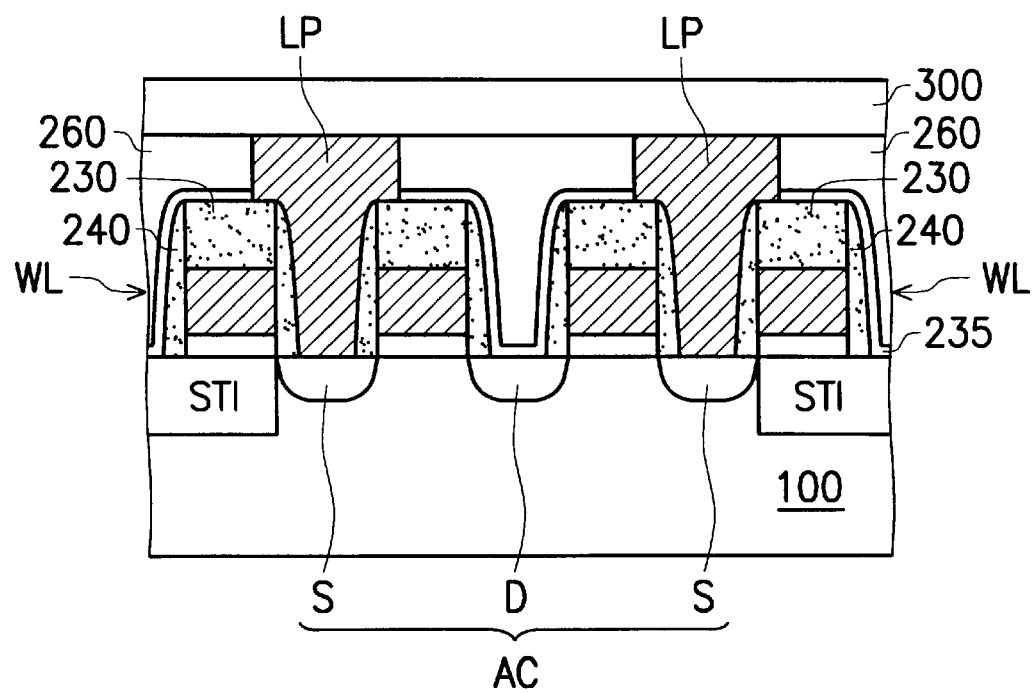

Referring to the FIG. 4, a landing pad (TP), which is formed with an offset distance d away from and along the word line is coupled to the source region (S) through the isolation layers 260 and 235, wherein the isolation layer 235 acts as a buffer layer.

As shown the FIG. 4, a patterned photoresist (not shown in the FIG. 4) is formed by the photolithography process (coating, exposure, and developing). On the isolation layer 260, a patterned photoresist is formed with an offset distance d away from and along the word line. Then, using the patterned photoresist as a mask, etch the isolation layer 260 and the isolation layer 235 to form the contact window of a part of the source region (not shown in the FIG. 4) by an etching process, e.g., anisotropic etching. After depositing a polysilicon layer to fill up the contact window by the CVD deposition process and planarizing the polysilicon layer by a planarization process, e.g., CMP, and etching back, a polysilicon landing pad is formed, wherein the landing pad is formed with an offset distance d away from and along the word line. Then an isolation layer 300 is formed to cover the isolation layer 260 and the landing pad (LP) . The isolation layer 300 may be an oxide layer formed by CVD process and planarized by the planarization process, e.g., CMP and etching back.

Figure 5A:
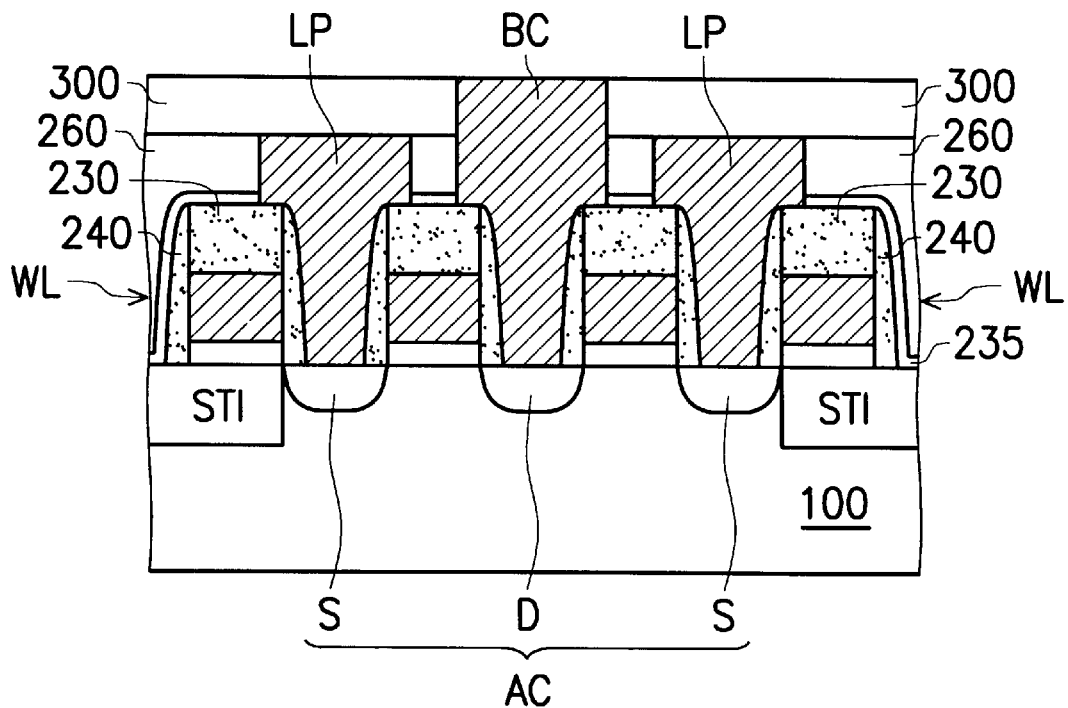
Figure 5B:
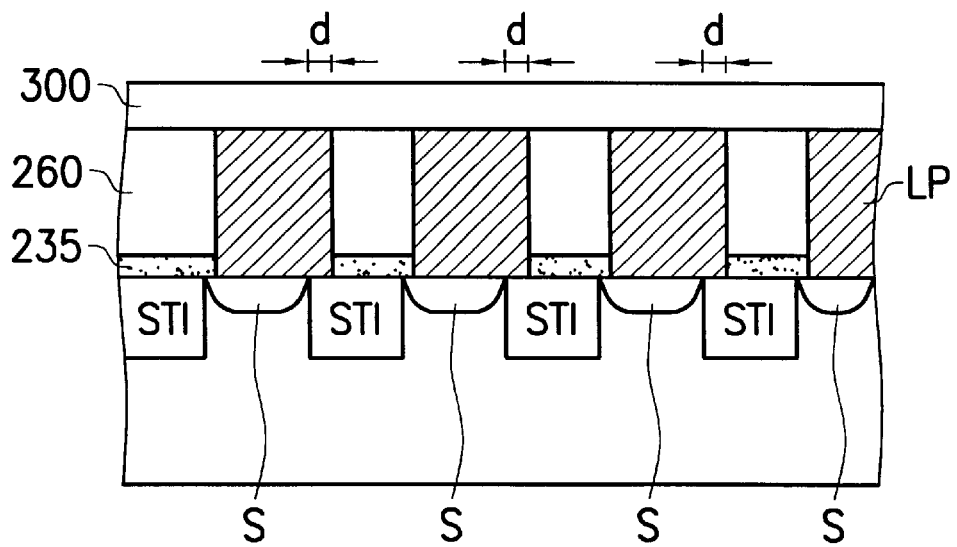
Figure 5C:
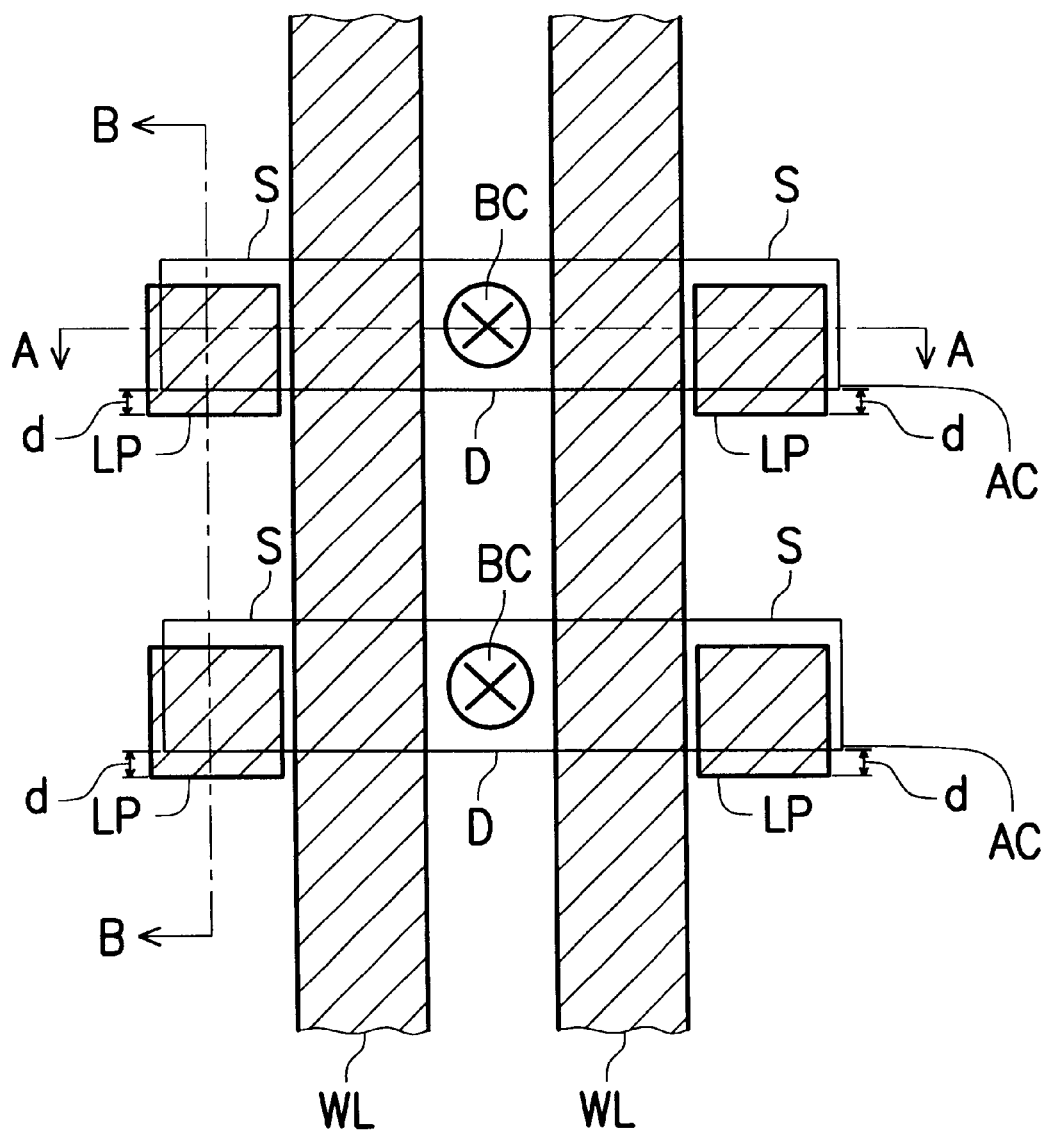

Referring to the FIGS. 5A, 5B, and 5C, the bit line contact is formed and coupled to the drain region (D) along the isolation layers 300, 260, and 235, wherein the FIG. 5A shows a perpendicular cross sectional view of the word line, which is the sectional view along the line A—A in the FIG. 5C. FIG. 5B shows a cross sectional view in the direction parallel to the word line, which is the sectional view along the line B—B in the FIG. 5c. FIG. 5C shows a layout view of this step.

As shown in the FIG. 5A, a patterned photoresist (not shown in the FIG. 5A) is formed on the isolation layer 300 by the photolithography process. Then, using the patterned photoresist as a mask, etch the isolation layers 300, 260, and 235 to form the contact window of a part of the drain region (not shown in the FIG. 5A) by an etching process, e.g., anisotropic etching. After depositing a polysilicon layer to fill up the contact window by the CVD deposition process and planarizing the polysilicon layer by a planarization process, e.g., CMP and etching back, a polysilicon bit line contact pad (BC) is formed.

As shown in the FIGS. 5B and 5C, the landing pad (LP) is formed with an offset distance d away from and along the word line. FIG. 5C shows that the bit line contact pads are on the drain region of the active region AC.

Figure 6A:
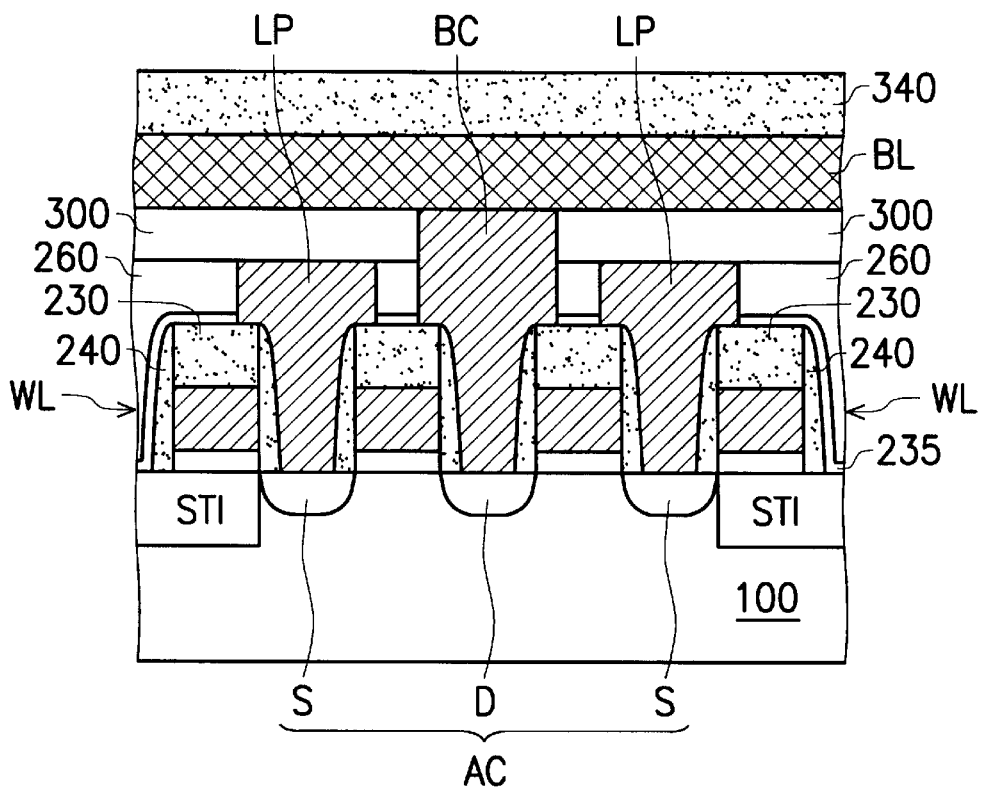
Figure 6B:
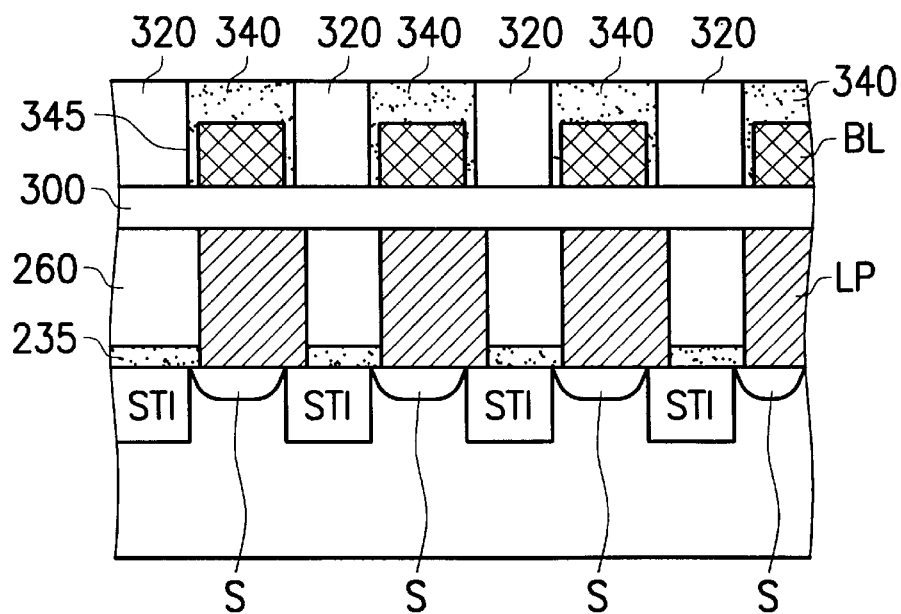
Figure 6C:
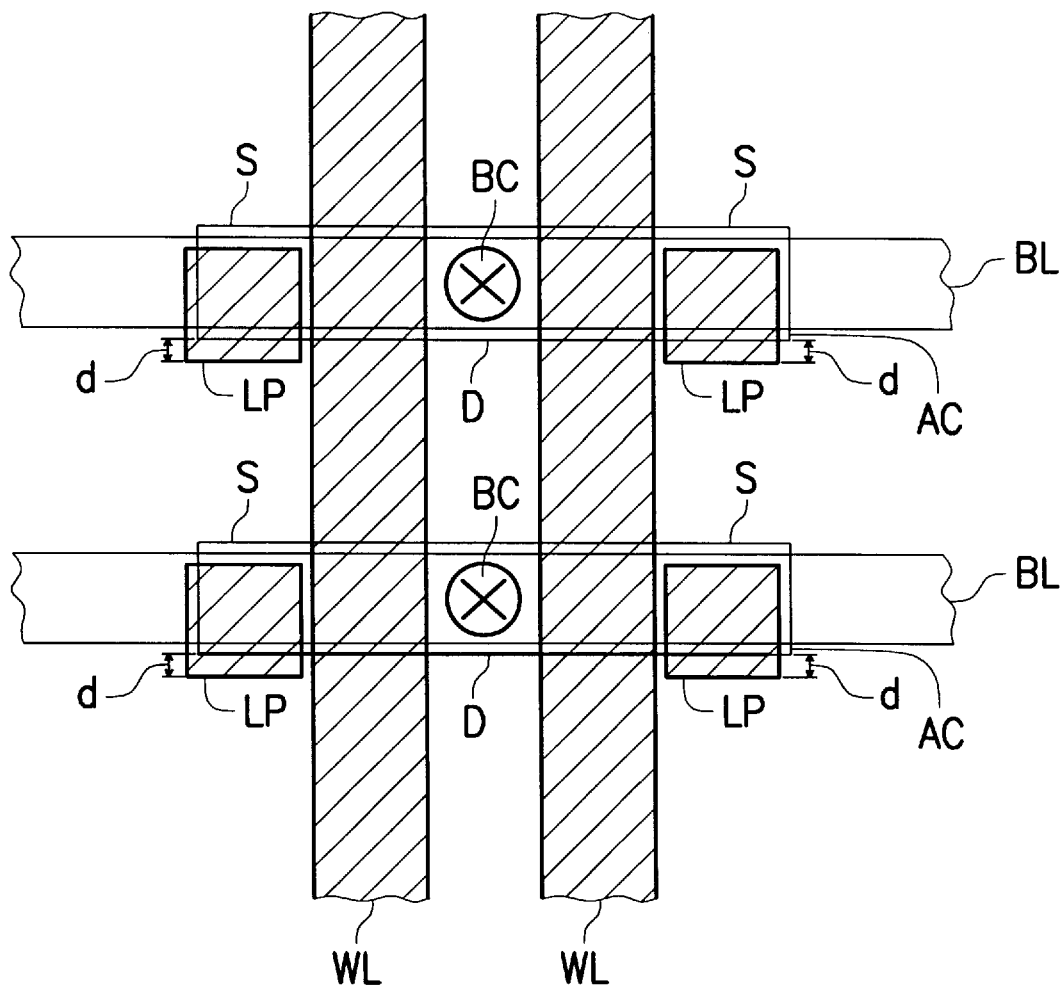

Referring to the FIGS. 6A, 6B, and 6C, form at least one bit line separated by the nitride silicon top layer 340 perpendicular to the word lines and coupled to the bit line contact pads, wherein the FIG. 6A shows a perpendicular cross sectional view of the word line, the FIG. 6B shows a cross sectional view in the direction parallel to the word line, and the FIG. 5c shows a layout view of this step.

Referring to the FIGS. 6A and 6B, an isolation layer 320 is formed to cover the isolation layer 300 and the bit line contact pads (BC) by the CVD process. Then a bit line, composed of tungsten and separated by nitride silicon top layer 340 and nitride silicon side wall layer 345 and coupled to the bit line contact pad (BC), is formed by bit line dual-damascene process.

The FIG. 6C shows that because of the landing pad is formed with an offset distance d, the partial landing pad will be out of the bit line (BL).

The FIGS. 8A~8D illustrates the aforementioned bit line dual-damascene process.

Figure 8A:
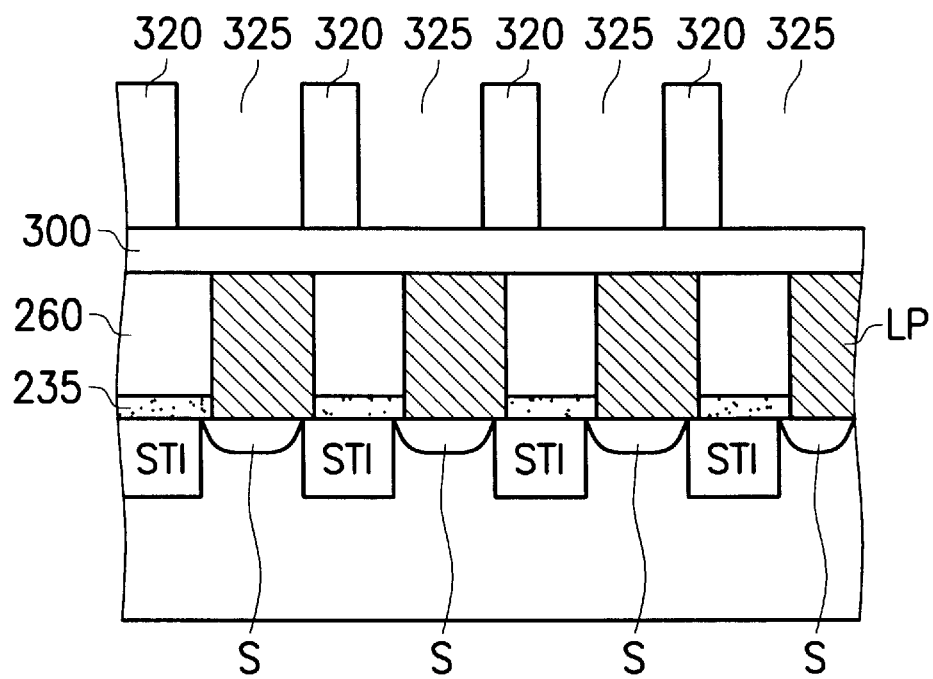

As shown in the FIG. 8A, an oxide layer is formed by CVD process to be an isolation layer. After a photolithography and etching process, the isolation layer 320, which comprises a trench 325 and sticks out of the bit line contact pad, is defined.

Figure 8B:
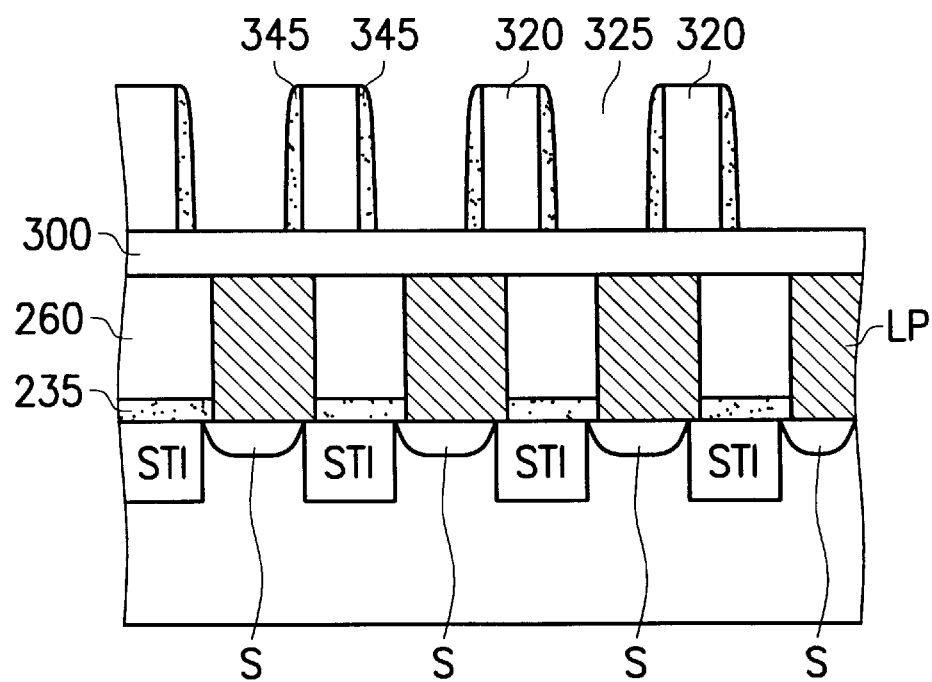

Next, as shown in the FIG. 8B, an isolation layer is formed. For example, a nitride silicon layer is conformably deposited on the isolation layers 300 and 320; then it is etched back to form a nitride silicon side wall layer 345.

Figure 8C:
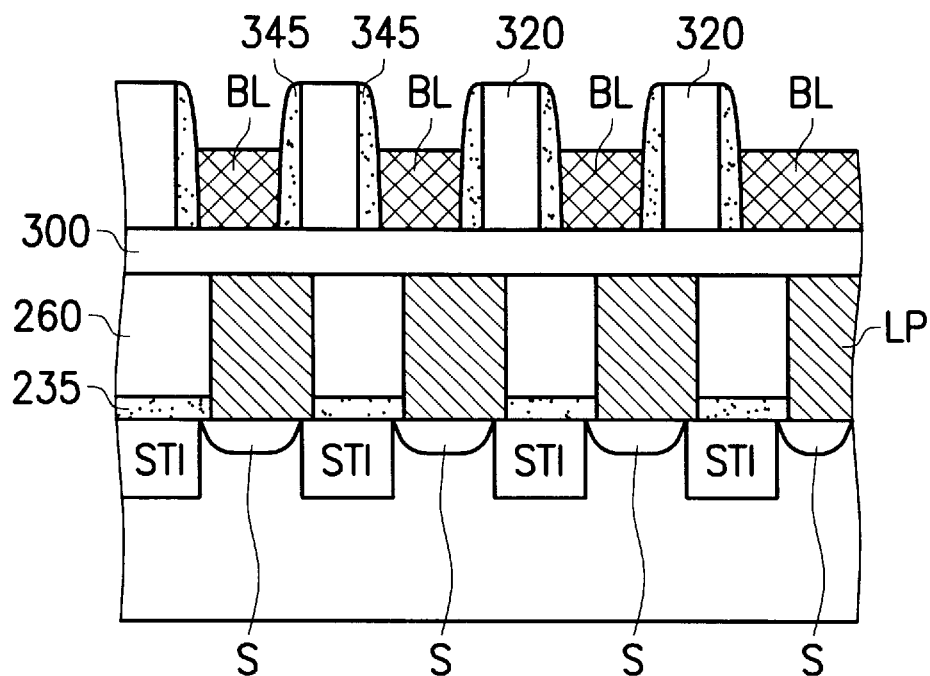

As shown in the FIG. 8C, a tungsten layer is formed by the CVD process, e.g., blanket tungsten deposition, then it is etched back to be lower than the isolation layer 320a to form a bit line (BL), which is coupled to the bit line contact pad.

Figure 8D:
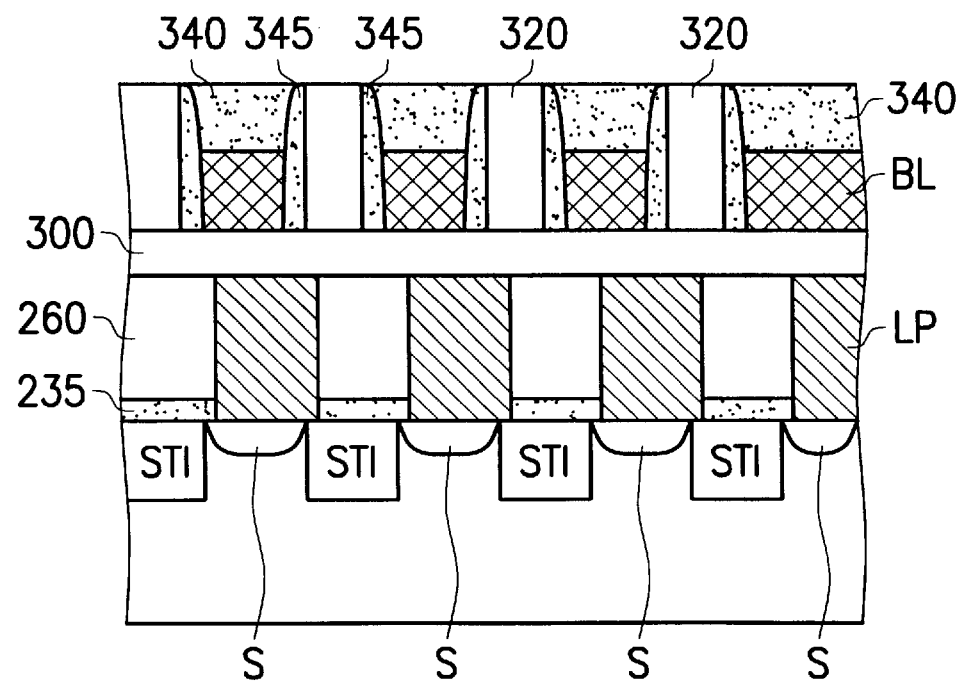

As shown in the FIG. 8D, a nitride silicon top layer 340 is formed. For example, a nitride silicon layer is deposited to fill up the trench and to extend to the oxide layer 320; then it is planarized to formed a nitride silicon top layer 340 by a planarization process, e.g., CMP and etched back. Then the steps of building the bit lines by the dual-damascene process is finished.

Figure 7A:
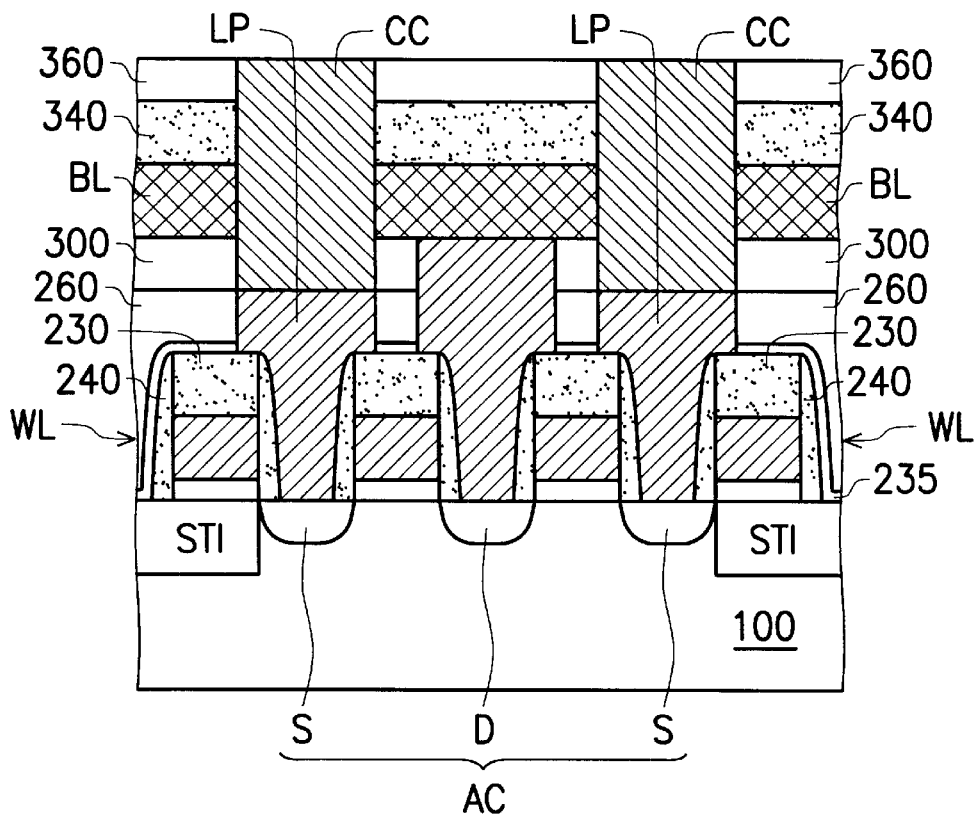
Figure 7B:
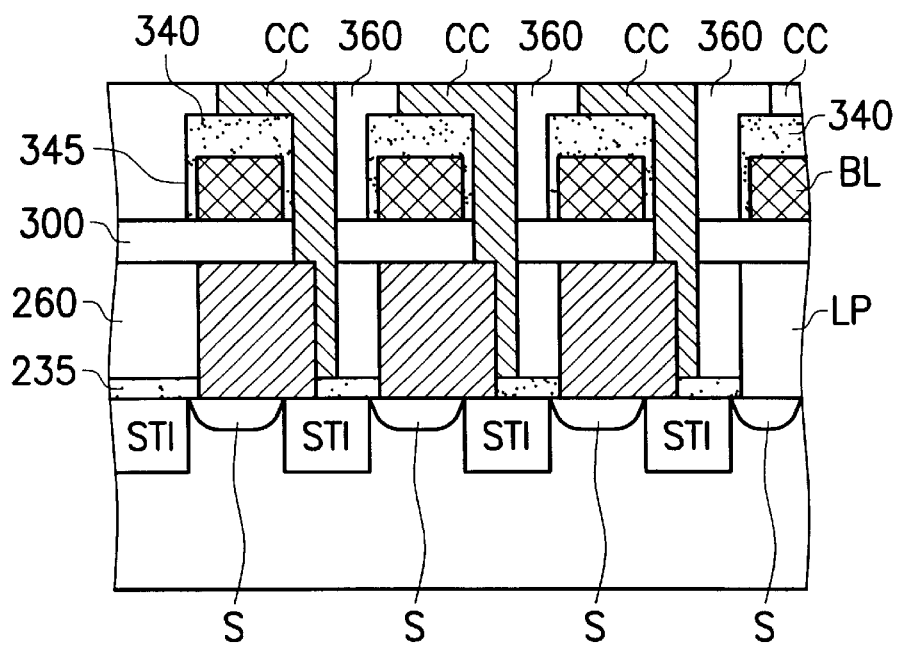
Figure 7C:
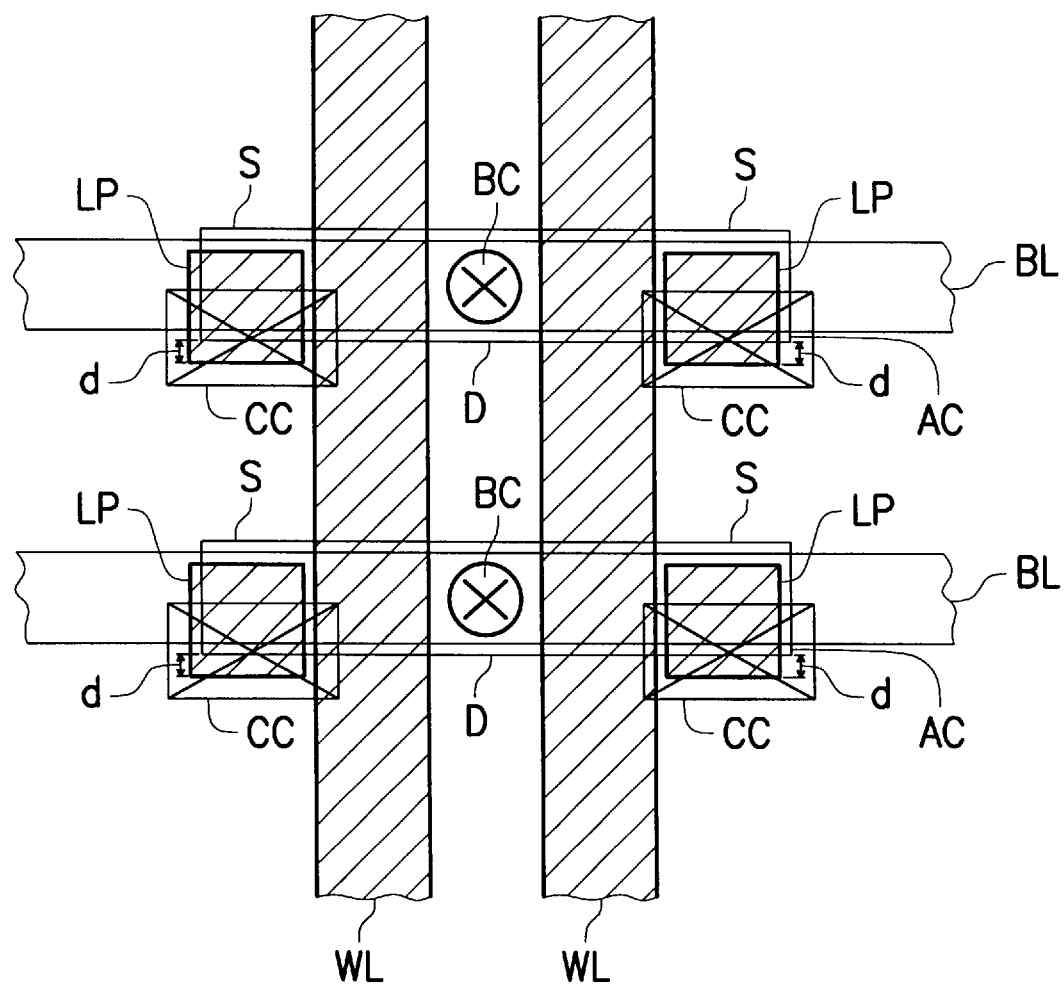

As shown in the FIGS. 7A, 7B, and 7C, an isolation layer 360 is formed to cover the bit lines, which is separated by the nitride silicon top layer 340 and nitride silicon side wall layer 345. Then a capacitor-node contact plug (CC), which is coupled to the side wall and the a part of the top of the landing pad (LP), is formed through the isolation layers 360, 300, and 260, wherein the FIG. 7A shows a perpendicular cross sectional view of the word line, the FIG. 7B shows a cross sectional view in the direction parallel to the word line, and the FIG. 7C shows a layout view of this step.

Referring to the FIGS. 7A and 7B, an isolation layer 360 is formed to cover the bit line, which is separated by the nitride silicon top layer 340, and the nitride silicon side wall 345, and then a patterned photoresist (not shown in the FIGS. 7A and 7B) is formed on the isolation layer 360 by the photolithography process. Then using a patterned photoresist as a mask, and selecting a nitride silicon buffer layer 235 as an etching stop layer, a contact window is formed by the etching process, e.g., anisotropic etching. The contact window extends over the side wall and a part of the top of the landing pad. After depositing a polysilicon layer to fill up the contact window by the CVD process and planarizing the polysilicon layer by the planarization process, e.g., CMP and etching back, the polysilicon capacitor-node contact plug (CC) is formed.

According to the FIGS. 7B and 7C, the word lines (WL) and the bit lines (BL) are separated by the nitride layer; the landing pad (LP) is formed with an offset distance d away from and along the word line, and sticks out of the bit line (BL), so the polysilicon capacitor-node contact plugs will increase the contact area by coupling to the top and the side wall of the landing pads, and the tolerance is effectively increased.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for producing capacitor-node contact plugs of a dynamic random access memory, comprising:

provide a semiconductor substrate;

forming at least one gate structure separated by a first isolation layer as a word line, and forming a source region and a drain region next to the word line;

forming a second isolation layer to cover the first isolation layer, word line, source region, and drain region;

forming a first landing pad, which passes through the second isolation layer and couples to the source region, wherein the first landing pad is offset a given distance along the word line;

forming a third isolation layer to cover the second isolation layer and the first landing pad;

forming a second landing pad coupled to the drain region through the second isolation layer and the third isolation layer;

forming at least one bit line separated by a fourth isolation layer along the vertical direction to the word line, wherein the at least one bit line is coupled to the second landing pad;

forming a fifth isolation layer to cover the at least one bit line separated by the fourth isolation layer; and forming a capacitor-node contact plug, which is coupled to the side wall and a part of the top of the first landing pad through the fifth isolation layer, the third isolation layer, and the second isolation layer.

2. The method as claimed in claim 1, wherein the first isolation layer comprises nitride silicon side wall layer and nitride silicon top layer, which is used for isolating the side wall and the top of the gate structure.

3. The method as claimed in claim 1, wherein the second isolation layer is an oxide layer.

4. The method as claimed in claim 1, wherein the first landing pad is made of polysilicon.

5. The method as claimed in claim 1, wherein the third isolation layer is an oxide layer.

6. The method as claimed in claim 1, wherein the second landing pad is made of polysilicon.

7. The method as claimed in claim 1, wherein the fourth isolation layer is made of nitride silicon.

8. The method as claimed in claim 1, wherein the fifth isolation layer is an oxide layer.

9. The method as claimed in claim 1, wherein the capacitor-node contact plug is composed of polysilicon.

10. A method for producing capacitor-node contact plugs of a dynamic random access memory, comprising:

providing a semiconductor substrate;

forming an isolation structure for defining a rectangular active region on the semiconductor substrate;

forming at least one gate structure separated by a first isolation layer as the word line, and forming a source region and a drain region next to the word line on the rectangular active region;

forming a buffer layer conformal to the word Line and the semiconductor substrate.

forming a second isolation layer to cover the first isolation layer, the buffer layer, word line, source region, and drain region;

forming a first landing pad, wherein the first landing pad offset a given distance along the word line, which passes through the second isolation layer and the buffer layer and coupled to the source region;

forming a third isolation layer to cover the second isolation layer and the first landing pad;

forming a second landing pad coupling to the drain region through the second isolation layer, the third isolation layer, and the buffer layer;

forming at least one bit line separated by a fourth isolation layer along a vertical direction to the word line, wherein the at least one bit line is coupled to the second landing pad;

forming a fifth isolation layer to cover the at least one bit line separated by the fourth isolation layer; and forming a capacitor-node contact plug, which is coupled to the side wall and a part of the top of the first landing pad through the fifth isolation layer, the third isolation layer, and the second isolation layer to the buffer layer.

11. The method as claimed in claim 10, wherein the first isolation layer comprises a nitride silicon side wall layer and a nitride silicon top layer, which is used for isolating the side wall and the top of the gate structure.

12. The method as claimed in claim 10, wherein the buffer layer is made of nitride silicon.

13. The method as claimed in claim 10, wherein the second isolation layer is an oxide layer.

14. The method as claimed in claim 10, wherein the first landing pad is made of polysilicon.

15. The method as claimed in claim 10, wherein the third isolation layer is an oxide layer.

16. The method as claimed in claim 10, wherein the second landing pad is made of polysilicon.

17. The method as claimed in claim 10, wherein the fourth isolation layer is made of nitride silicon.

18. The method as claimed in claim 10, wherein the fifth isolation layer is an oxide layer.

19. The method as claimed in claim 10, wherein the capacitor-node contact plug is made of polysilicon.

* * * * *